(12) United States Patent
Ryu et al.

(10) Patent No.: US 7,176,704 B2
(45) Date of Patent: Feb. 13, 2007

(54) INSPECTING APPARATUS FOR SEMICONDUCTOR DEVICE

(75) Inventors: Je-hyoung Ryu, Suwon (KR); Tae-gyu Kim, Hwasung (KR); Soon-kyu Yim, Seongnam (KR); Sung-jin Lee, Suwon (KR); Jun-ho Lee, Yongin (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 15 days.

(21) Appl. No.: 10/823,546

(22) Filed: Apr. 14, 2004

(65) Prior Publication Data

US 2004/0263194 A1 Dec. 30, 2004

(30) Foreign Application Priority Data

Jun. 26, 2003 (KR) .................. 10-2003-0042144

(51) Int. Cl.
*G01R 31/02* (2006.01)
(52) U.S. Cl. .................................... 324/760
(58) Field of Classification Search ............... 324/760, 324/765, 158.1; 165/80.3–80.4, 104.1, 104.21, 165/272, 81–83; 361/697
See application file for complete search history.

(56) References Cited

U.S. PATENT DOCUMENTS

| | | | | |
|---|---|---|---|---|
| 5,929,651 A | * | 7/1999 | Leas et al. | 324/765 |
| 6,049,217 A | * | 4/2000 | Viswanath et al. | 324/760 |
| 6,111,421 A | * | 8/2000 | Takahashi et al. | 324/758 |
| 6,720,784 B2 | * | 4/2004 | Martter et al. | 324/760 |

FOREIGN PATENT DOCUMENTS

| | | |
|---|---|---|
| CN | 2003-14812 | 1/2003 |
| KR | 1999-88521 | 12/1999 |
| KR | 2003-6195 | 1/2003 |

OTHER PUBLICATIONS

KIPO Office Action, Mar. 31, 2005.
Korean Utility Model #20-0157983.

* cited by examiner

*Primary Examiner*—Ha Tran Nguyen
*Assistant Examiner*—Tung X. Nguyen
(74) *Attorney, Agent, or Firm*—Staas & Halsey LLP

(57) ABSTRACT

An inspecting apparatus for semiconductor devices including: a match plate; a contact module combined with the match plate, and the match plate including a radiation unit radiating heat from the semiconductor devices to the outside, and a test unit contacting leads of the semiconductor; an insert module installed on a bottom of the contact module, and having a semiconductor device accommodator to accommodate the semiconductor device; and an auxiliary radiation member installed on a bottom of the insert module, and radiating the heat from the semiconductor device to the outside. Accordingly, the inspecting apparatus for semiconductor device according to the present invention performs testing at a constant temperature regardless of heat from the semiconductors by radiating the heat from the semiconductors immediately and efficiently, thereby producing more accurate test results. Accurate testing improves productivity and saves expense by removing faulty test results caused by identifying a qualified semiconductor as a defective semiconductor due to heat radiated from the semiconductor device.

26 Claims, 10 Drawing Sheets

INSPECTING APPARATUS FOR SEMICONDUCTOR DEVICE

CROSS-REFERENCE TO RELATED APPLICATIONS

This application claims the benefit of Korean Patent Application No. 2003-042144, filed Jun. 26, 2003, in the Korean Intellectual Property Office, the disclosure of which is incorporated herein by reference.

BACKGROUND OF THE INVENTION

1. Field of the Invention

The present invention relates to an inspecting apparatus for a semiconductor device, more particularly to an inspecting apparatus for a semiconductor device which is capable of improving the efficiency with which semiconductor devices radiating heat are cooled during testing.

2. Description of the Related Art

Handler devices are used to test the durability of semiconductor devices with respect to heat. Handler devices are divided into two groups, handlers to distinguish defective semiconductor devices from qualified semiconductor devices, and chambers to keep a constant temperature during testing.

Generally, while testing the characteristics of semiconductor devices produced in a manufacturing process using a handler device, the semiconductor devices are conveyed from the manufacturing process to a testing process in a carrier module of a test tray as disclosed in Korean utility model number 20-0157983.

Semiconductor devices accommodated in conventional carrier modules radiate heat during testing, and the radiated heat may change the electrical characteristics of the semiconductor device. The heat radiated from a semiconductor device is transferred away from the semiconductor device by a radiation unit that contacts the top of the semiconductor device.

Although the heat radiated from the top of the semiconductor device is transferred by the radiation unit, the heat radiated from the bottom of the semiconductor device is not transferred away from the semiconductor device. If the heat from the bottom of the semiconductor device could be transferred away from the semiconductor device, the semiconductor device could be cooled efficiently and uniformly during testing regardless of the heat radiated from the semiconductor device, thereby preventing additional expense and a decrease of productivity due to a re-testing. Also, faulty test results caused by incorrectly identifying qualified semiconductor devices as defective semiconductor devices would be minimized.

SUMMARY OF THE INVENTION

Accordingly, it is an aspect of the present invention to provide an inspecting apparatus for semiconductor devices which is capable of improving the efficiency of cooling semiconductor devices that radiate heat during testing.

Additional aspects and advantages of the invention will be set forth in part in the description which follows and, in part, will be obvious from the description, or may be learned by practice of the invention.

The foregoing and/or other aspects of the present invention are achieved by providing an inspecting apparatus for semiconductor devices, the apparatus comprising: a match plate; a contact module combined with the match plate, the match plate comprising a radiation unit to transfer heat from the semiconductor device and a tester to contact the leads of the semiconductor; an insert module installed on the bottom of the contact module having a semiconductor device accommodator to accommodate the semiconductor device; and an auxiliary radiation member installed on a bottom of the insert module to transfer heat from the semiconductor device.

According to an aspect of the present invention, the insert module is partitioned into a plurality of semiconductor device accommodators by a horizontal partition wall and a vertical partition wall.

According to an aspect of the present invention, the insert module is formed with an upper opening, through which a semiconductor device is inserted into the semiconductor device accommodator, and a bottom opening corresponding to the upper opening. The auxiliary radiation member is disposed on the bottom of the insert module along a longitudinal direction of the insert module to contact the bottom of the semiconductor device through the bottom opening.

According to an aspect of the present invention, each semiconductor device accommodator has a pair of latch members to support opposite sides of the semiconductor device.

According to an aspect of the present invention, the auxiliary radiation member is made of a material containing aluminum.

According to an aspect of the present invention, the insert module and the auxiliary radiation member are combined into one module.

According to an aspect of the present invention, the radiator comprises: a heat sink; a contact pusher to contact a semiconductor device; and a heat flat pusher provided between the contact pusher and the heat sink to transfer heat from the semiconductor device to the heat sink via the contact pusher.

According to an aspect of the present invention, the tester comprises: a contact block combined with the match plate and formed with a heat sink seat to accommodate the heat sink, and a through hole through which the heat flat pusher passes; and a lead pusher combined with a bottom of the contact block to contact the leads of the semiconductor device selectively according to the elevation of the contact block.

According to an aspect of the present invention, the contact block is formed with an air inlet through which air flows into the heat sink seat and an air outlet through which the air flows out of the heat sink seat.

According to an aspect of the present invention, the inspecting apparatus for semiconductor devices further comprises: a first elastic member installed on a circumferential part of the heat flat pusher to allow the contact block and the lead pusher to move up and down elastically; and a second elastic member installed between the match plate and the contact block to allow the lead pusher to press against the leads of the semiconductor by changing the elevation of the contact block using the match plate.

According to an aspect of the present invention, the first elastic member and the second elastic member comprise springs.

According to an aspect of the present invention, the heat sink, the contact pusher, and the heat flat pusher are made of material containing the aluminum.

BRIEF DESCRIPTION OF THE DRAWINGS

These and/or other aspects and advantages of the present invention will become apparent and more readily appreciated from the following description of the embodiments, taken in conjunction with the accompany drawings of which.

DETAILED DESCRIPTION OF THE EMBODIMENTS

Figure 1:
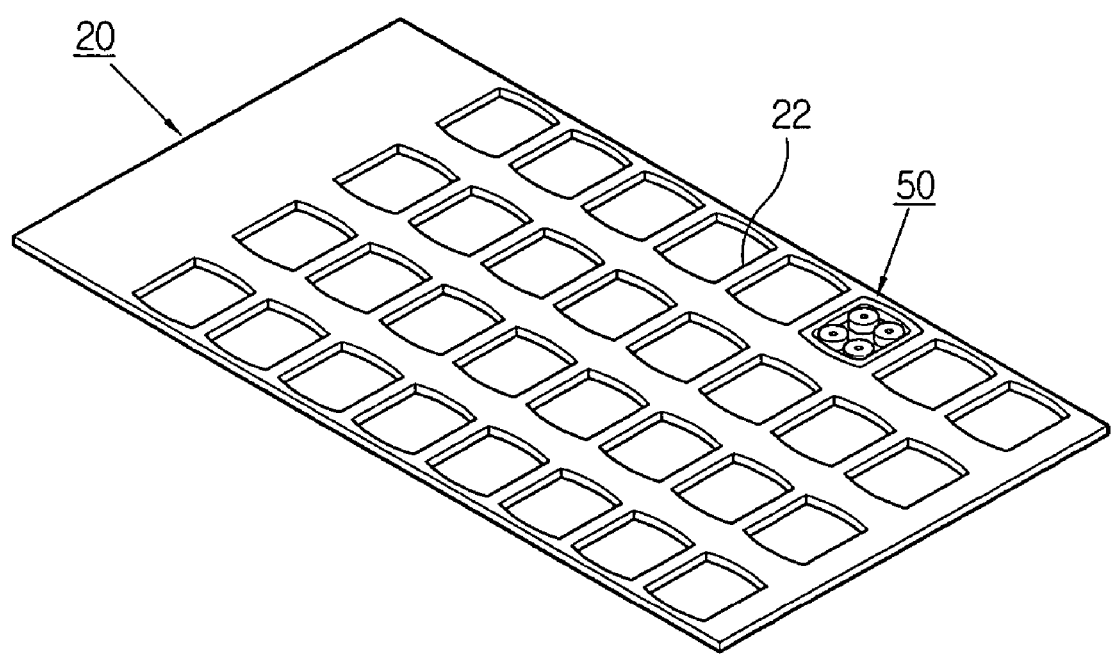
FIG. 1 a perspective view of an inspecting apparatus for a semiconductor device according to an embodiment of the present invention.

Reference will now be made in detail to embodiments of the present invention, examples of which are illustrated in the accompanying drawings, wherein like reference numerals refer to like elements throughout. The embodiments are described below in order to explain the present invention by referring to the figures.

Figure 2:
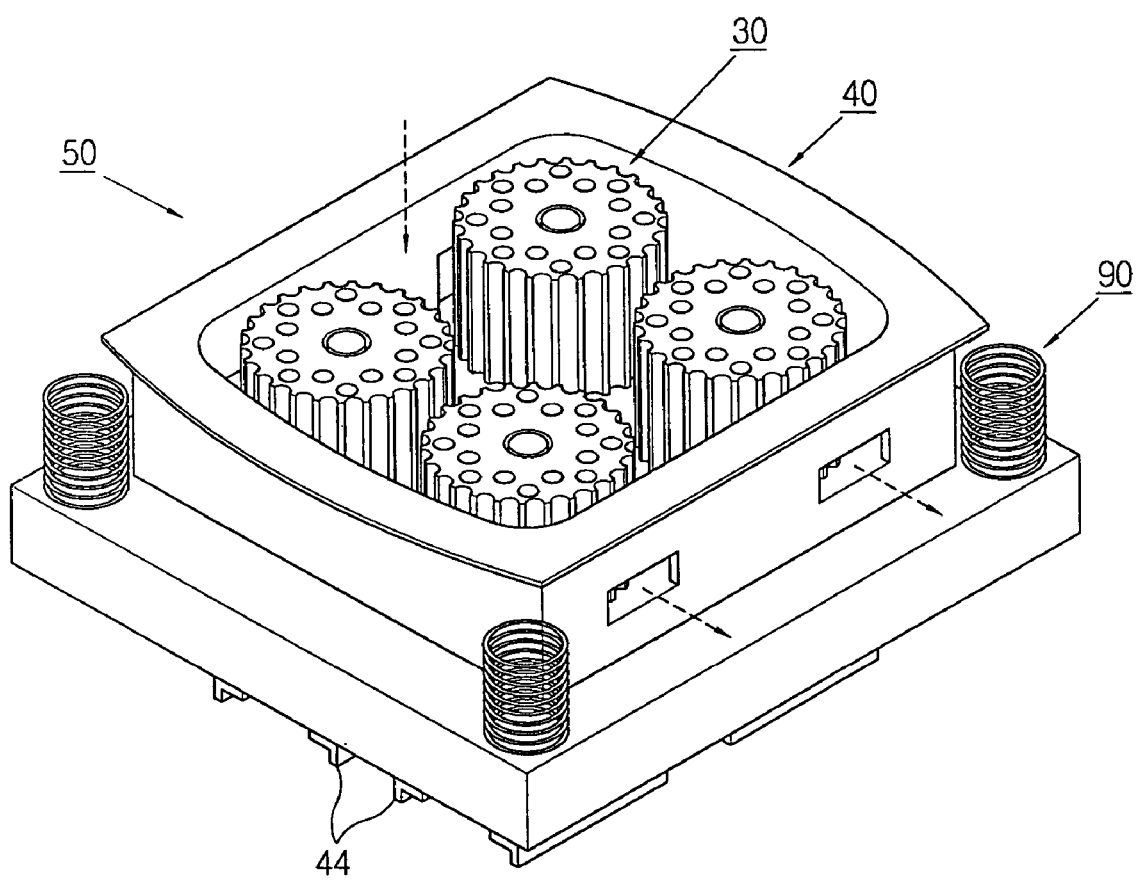
FIG. 2 is a perspective view of a contact module of the inspecting apparatus for semiconductor devices according to the present invention.
Figure 3:
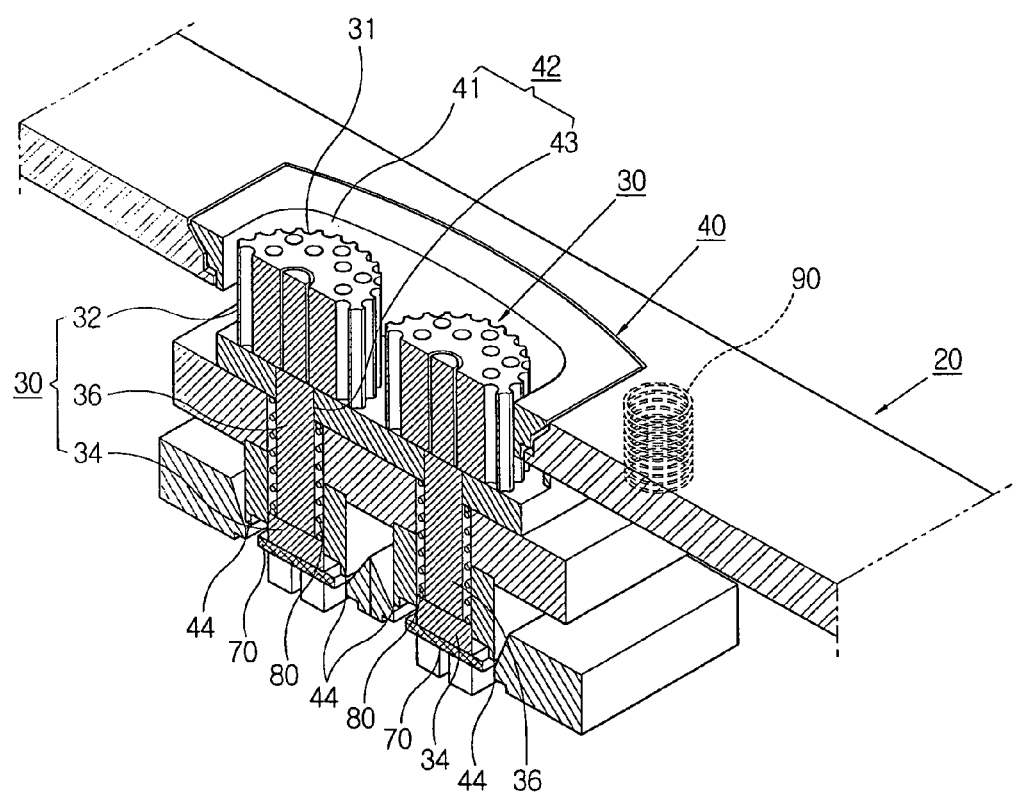
FIG. 3 is a cross-sectional view illustrating a combining structure of a match plate and the contact module of the inspecting apparatus for semiconductor devices according to the present invention.

FIG. 1 is a perspective view of an inspecting apparatus for semiconductor devices according to the present invention. FIG. 2 is a perspective view of a contact module of the inspecting apparatus for semiconductor devices according to the present invention. FIG. 3 is a cross-sectional view illustrating a combining structure of a match plate and the contact module of the inspecting apparatus for semiconductor devices according to the present invention.

The inspecting apparatus for semiconductor devices according to the present invention, as illustrated in FIGS. 1 through 3, comprises a match plate 20 capable of lifting up and down, and a contact module 50 installed on the match plate 20.

The match plate 20 is formed with a plurality of combining holes 22 respectively combinable with the plurality of the contact modules 50. The match plate 20 lifts a tester 40 of the contact module 50 up and down selectively to test the durability of a semiconductor device 70 against heat. The structure of the match plate 20 may vary according to necessity.

The contact module 50 comprises a radiator 30 contacting the semiconductor device 70, and a tester 40 to contact the leads 72 of the semiconductor device 70.

The radiator 30 transfers heat from the semiconductor device 70 to the outside. As illustrated in FIG. 2 and FIG. 3, the radiator 30 comprises a heat sink 32, a contact pusher 34 to contact the semiconductor device 70, and a heat flat pusher 36, opposite sides of which combine with the contact pusher 34 and the heat sink 32, respectively, to transfer the heat from the semiconductor device 70 to the heat sink 32 via the contact pusher 34.

The heat sink 32 absorbs the heat transferred from the semiconductor device 70 through the contact pusher 34 and the heat flat pusher 36, and radiates the heat away from the semiconductor device 70. The heat sink 32 is formed with a plurality of groove strips 31 on a cylindrical surface to increase the area contacting air.

According to an aspect of the present invention the heat sink 32 is made of aluminum or a material containing aluminum due to aluminum's high thermal conductivity and competitive price. The structure of the heat sink 32 may vary to improve the efficiency of radiation.

A first side of the contact pusher 34 is formed with a flat contacting face to physically contact the semiconductor device 70 and a second side of the contact pusher 34 is screw-combined with the heat flat pusher 36. In alternate embodiments of the present invention, the contact pusher 34 and the heat flat pusher 36 are combined using alternate elements and/or devices such as adhesives or an epoxy.

The heat flat pusher 36 is a rod with a predetermined length. A first end of the heat flat pusher 36 is screw-combined with the heat sink 32. A second end of the heat flat pusher 36 is screw-combined with the contact pusher 34. Accordingly, the heat sink 32, the contact pusher 34, and the heat flat pusher 36 combine together to form the radiation unit 30. The heat flat pusher 36 and the contact pusher 34 are made of aluminum or a material containing aluminum, because aluminum has a high thermal conductivity and a competitive price. Similar to the combining of the contact pusher 34 and the heat flat pusher 26, alternate ways of combining the heat sink and the heat flat pusher are available in alternate aspects of the present invention.

A heat transfer path from the semiconductor device 70 begins with the contact pusher 34 absorbing the heat and ends with heat leaving the heat sink 32.

As illustrated in FIG. 3, the tester 40 of the contact module 50 comprises a contact block 42 combinable with the match plate 20, and a lead pusher 44. The lead pusher is provided under the contact block 42 to contact the leads 72 of the semiconductor device 70 selectively by ascent and descent of the contact block 42.

The contact block 42 is provided with a heat sink seat 41 to accommodate the heat sink 32, wherein the middle of the heat sink seat 41 is formed with a through hole 43 through which the heat flat pusher 36 passes. A side wall of the heat sink seat 41 is formed with an air outlet (not shown) to let out heated air that flowed in through an opening (not shown) formed on the upper side of the heat sink seat 41. Air enters the heat sink seat 41 of the contact block 42 through the opening (not shown), contacts the heat sink 32, absorbs the heat transferred from the semiconductor device 70 to the heat sink 32 via the flat pusher 36, and is exhausted through the air outlet (not shown) of the contact block 42.

The lead pusher 44 tests the durability of a semiconductor device 70 against heat by contacting the leads 72 of the semiconductor device 70 and electrically connecting the leads 72 to a test circuit (not shown).

A first elastic member 80 is installed on the heat flat pusher 36 of the radiator 30, and a second elastic member 90 is installed between the match plate 20 and the contact block 42. As the match plate 20 is lowered, the contact block 42, which is elastically combined with the match plate 20, presses the contact pusher 34 against the semiconductor device 70, and presses the lead pusher 44 against the leads 72 of the semiconductor device 70.

The first elastic member 80 elastically moves with the contact block 42 to press the contact pusher 34 against the semiconductor device 70. The match plate 20 and the contact block 42 are elastically combined by the second elastic member 90.

Figure 4A:
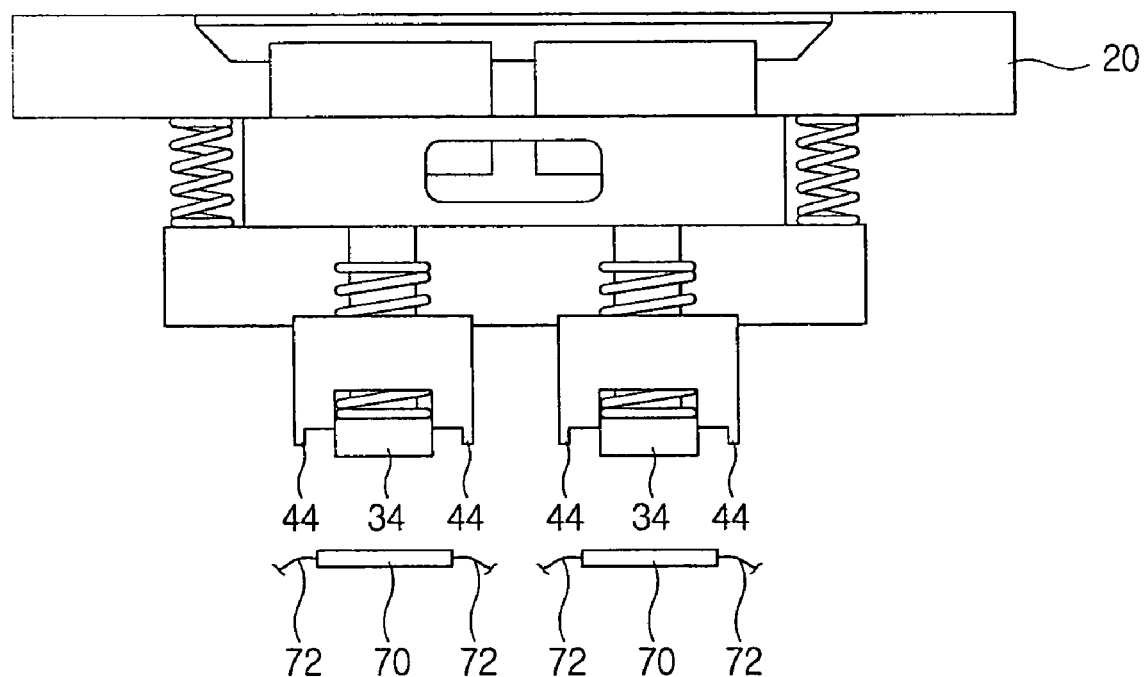
FIGS. 4A through 4C are operational views of the inspecting apparatus for semiconductor devices according to the present invention.

Operation of the inspecting apparatus for semiconductor devices according to the present invention will be described below in reference with FIGS. 4A through 4C.

The semiconductor device 70 is first inserted into the chamber. The semiconductor device 70 is positioned corresponding to the bottom of the contact pusher 34.

Figure 4B:
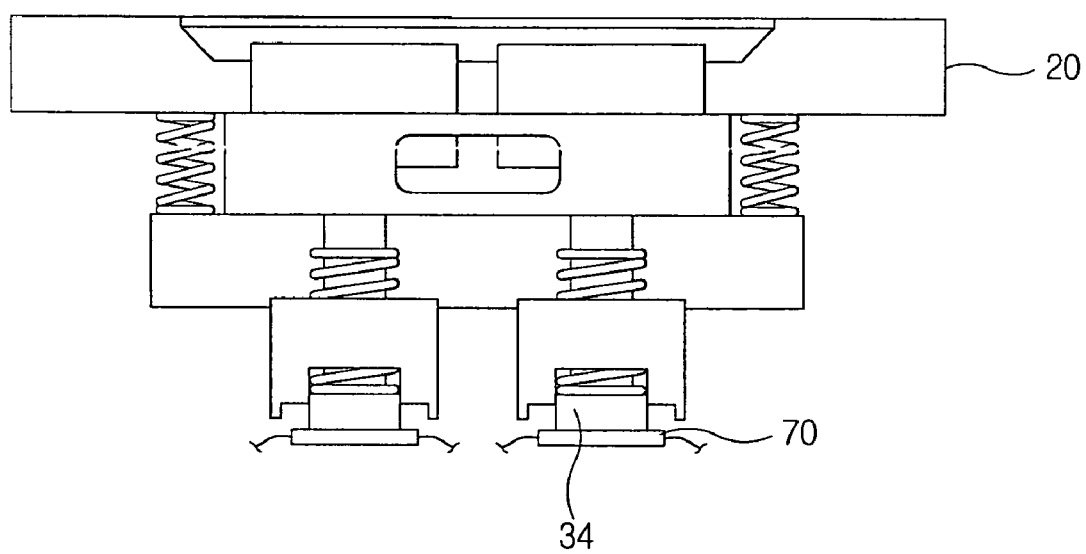
Figure 4C:
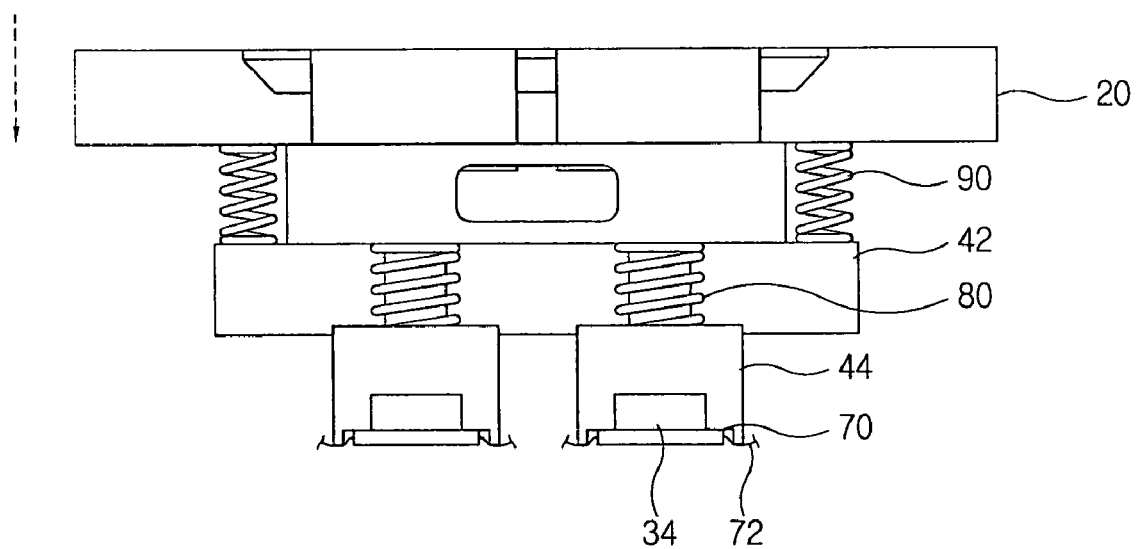

The contacting face of the contact pusher 34 contacts the top of the semiconductor device 70 by operation of the match plate 20 as shown in FIG. 4B. After physical contact is made between the contacting face of the contact pusher 34 and the semiconductor device 70, the match plate 20 descends enough to press the lead pusher 44 against the leads 72 of the semiconductor device 70. Herein, the contact block 42 moves by the operation of the match plate 20 electrically connecting the lead pusher 44 to the test circuit (not shown) as shown in FIG. 4C to perform testing.

Heat is transferred away from the semiconductor device 70 as follows. The contact pusher 34 contacts the top of the semiconductor device 70, absorbs the heat from the semiconductor device 70, and then transfers the heat to the heat sink 32 from the contact pusher 34 via the heat flat pusher 36. Accordingly, the heat transferred to the heat sink 32 from the semiconductor device 70 is absorbed by the air as the air flows into the heat sink seat 41 through the opening (not shown), contacts the heat sink 32, and is then exhausted to the outside.

In testing a characteristic of the semiconductor device 70 as described above, a test tray 69 is utilized to convey the semiconductor device 70 manufactured in a manufacturing process to the test process.

Figure 8:
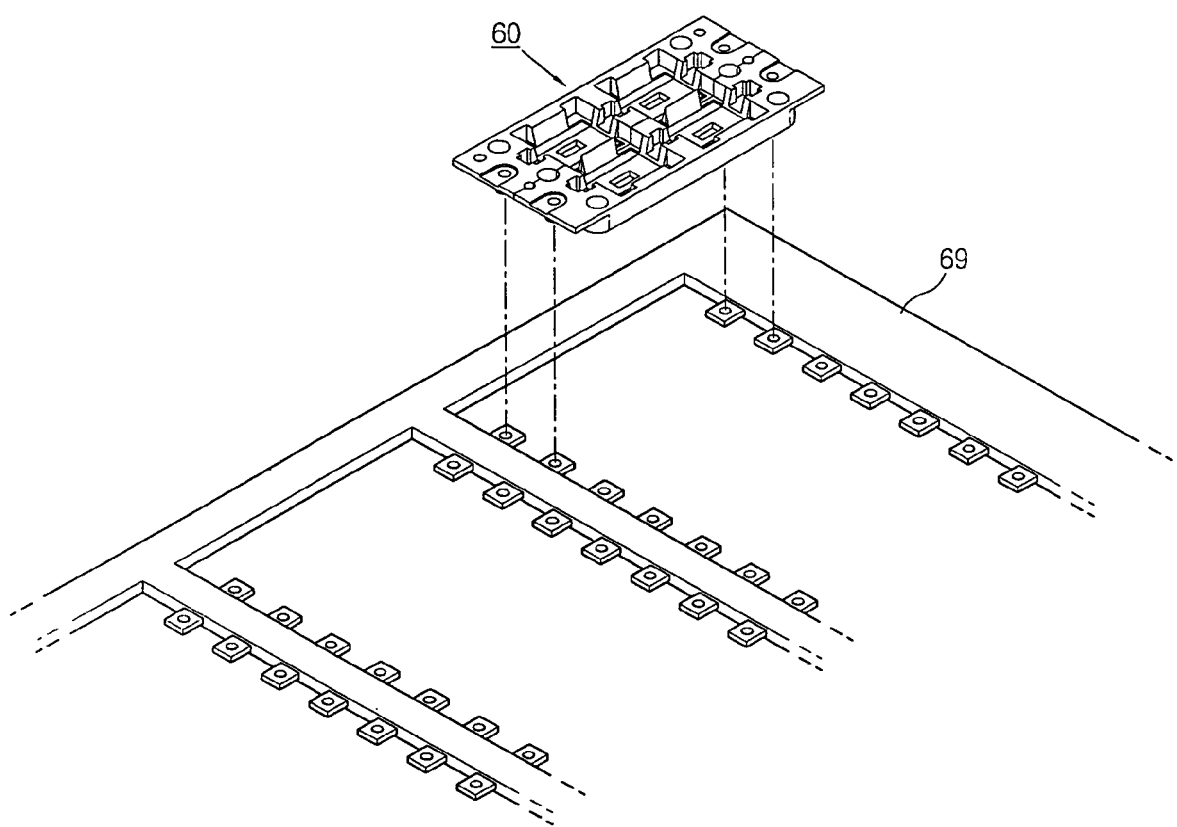
FIG. 8 is a perspective view of a test tray combined with the insert module according to FIG. 7.

As illustrated in FIG. 8, the test tray 69 is combined with a plurality of insert modules 60 that respectively accommodate each semiconductor device 70 to be tested. Here, the insert modules 60 are shaped like a box having an upper opening 64 and a bottom opening 65. The inset module 60 shown is made of material containing carbon particles.

Figure 5:
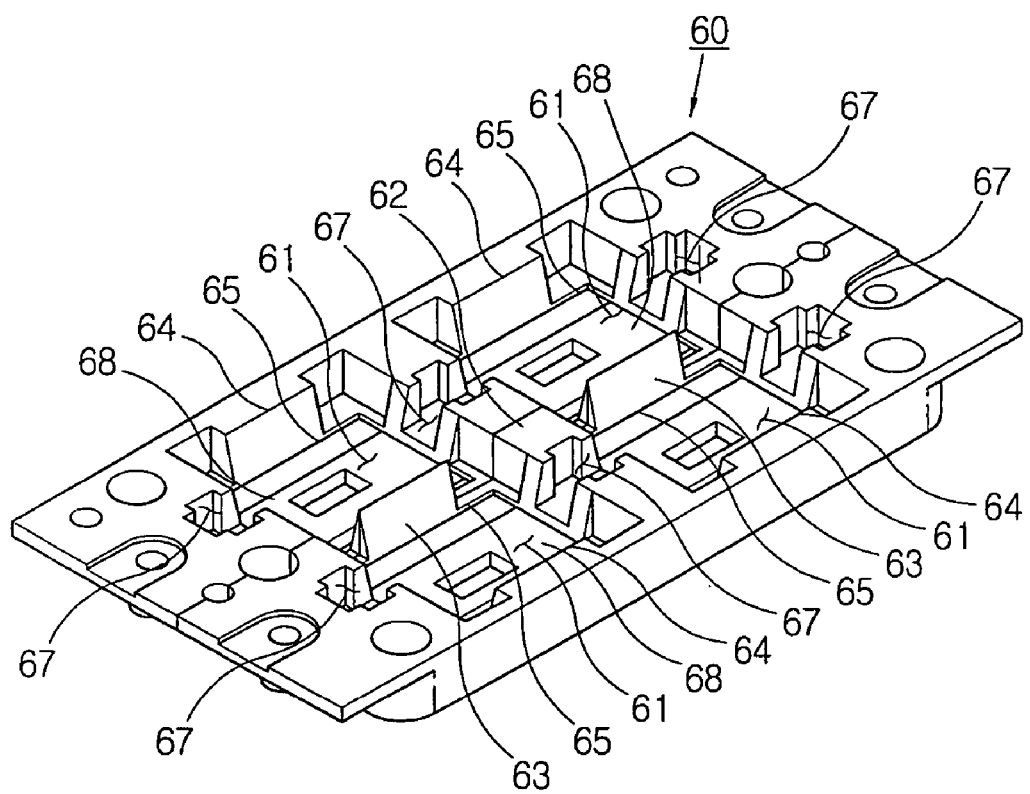
FIG. 5 is a perspective view of an insert module.

As illustrated in FIG. 5, the insert module 60 comprises a plurality of semiconductor device accommodators 61 to accommodate the plurality of the semiconductor devices 70, an upper opening 64 through which the semiconductor device 70 is inserted, a bottom opening 65 corresponding to the upper opening 64, and an auxiliary radiation member 68 on the bottom of the insert module 60.

The inside of the insert module 60 is partitioned into the plurality of semiconductor device accommodators 61 by a horizontal partition wall 62 and a vertical partition wall 63, both protruding inward from the bottom of the inside of the inset module 60. Each semiconductor device accommodator 61 has a pair of latches 66 installed on a latch installation 67 of the insert module 60 to support opposite sides of the semiconductor devices 70. The semiconductor devices are respectively inserted in each semiconductor device accommodator 61 so that the semiconductor devices 70 are exposed through the bottom opening 65 while contacting the auxiliary radiation member 68 closely.

Figure 6:
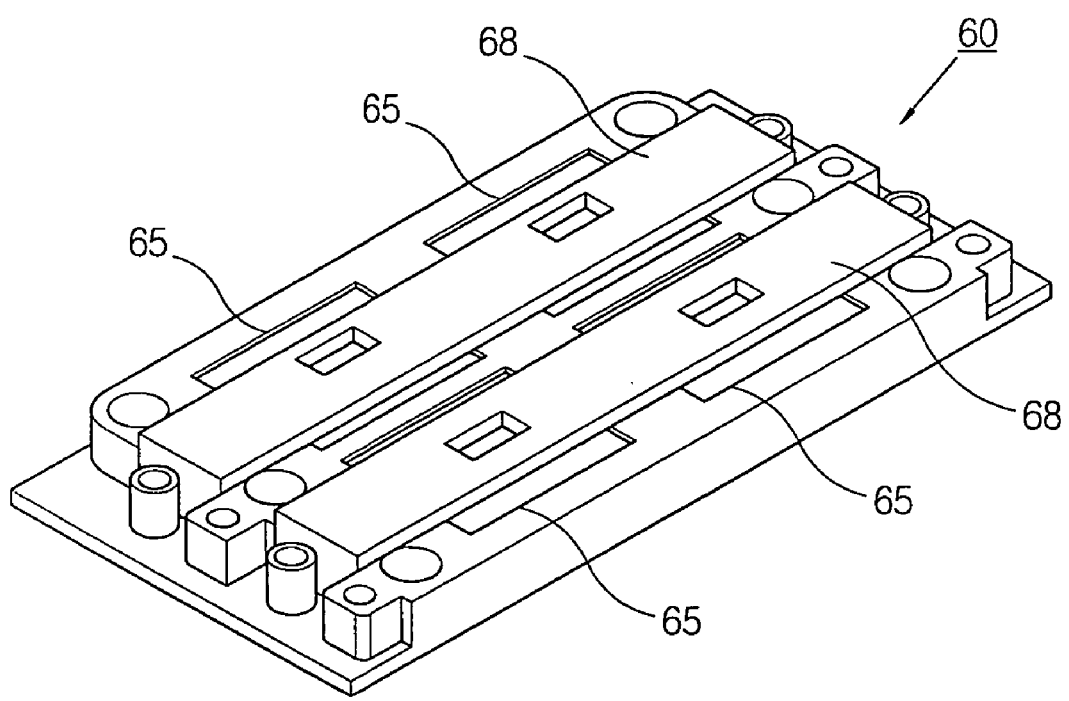
FIG. 6 is a rear perspective view of the insert module in FIG. 5.
Figure 7:
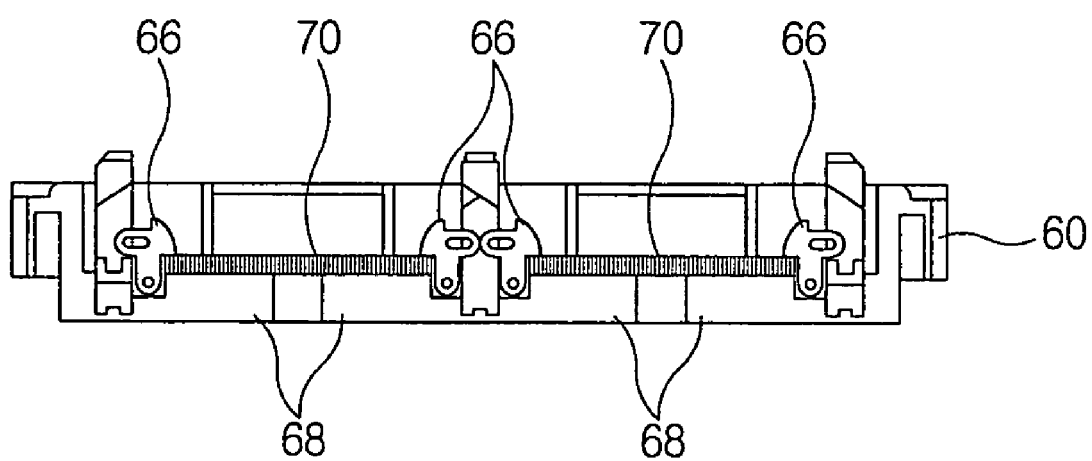
FIG. 7 is a side view of the insert module according to FIG. 6.

The plurality of the semiconductor device accommodators 61 may be provided in various forms. FIGS. 5–7 illustrate an embodiment providing four semiconductor device accommodators 61 in one insert module 60 to accommodate four semiconductor devices 70. Here, the semiconductor devices 70 respectively inserted into the semiconductor device accommodators 61 are each supported by a pair of the latches 66. The semiconductor devices 70 contact the auxiliary radiation members 68 closely through the bottom openings 65.

The auxiliary radiation members 68 are made of the aluminum, which has a high thermal conductivity, and are disposed on the bottom of the insert module 60 along the longitudinal direction of the insert module 60 as a pair in parallel to each other such that they contact the bottom of the semiconductor devices 70 through the bottom opening 65 of the semiconductor device accommodators 61.

The auxiliary radiation members 68 absorb heat radiated from the bottom of the semiconductor devices 70 during testing and transfer the heat away from the semiconductor devices 70. Accordingly, the contact pushers 34 contacting the top of the semiconductor devices 70 absorb heat from the semiconductor devices 70 and transfer the heat to the heat sinks 32 via the heat flat pushers 36 to radiate the heat to the outside. At the same time, the auxiliary radiation members 68 contacting the bottom of the semiconductor devices 70 absorb the heat radiated from the bottom of the semiconductor devices 70 and radiate the heat to the outside quickly and effectively, thereby improving cooling efficiency.

To provide the auxiliary radiation members 68 on the bottom of the insert module 60, the auxiliary radiation members 68 are made of the aluminum and should be inserted in a cast while the insert module 60 is being molded.

As described above, the radiator 30 radiates heat from the semiconductor devices 70 during testing while the auxiliary radiation members 68 absorb heat from the bottom of the semiconductor devices 70 and radiate the heat to the outside. The pair of the latches 66 support the opposite sides of the semiconductor devices 70. The bottom of the semiconductor devices 70 contact the auxiliary radiation members 68 through the bottom opening 65 of the insert module 60 closely when the semiconductor devices 70 are inserted into the semiconductor device accommodators 61. Accordingly, an immediate radiation effect unseen in the conventional art is achieved.

The inspecting apparatus for semiconductor devices according to the present invention transfers heat from the semiconductor devices 70 quickly and efficiently during testing, thereby allowing for more accurate test results by maintaining a constant temperature during testing.

Accurate testing minimizes faulty test results caused by identifying qualified semiconductors as defective semiconductors, and removes the need for repeated testing and the accompanying additional expense and a decline of productivity.

The radiation unit 30, according to the present invention, may be applied to various devices with improved compatibility.

As described above, the inspecting apparatus for semiconductor devices according to the present invention performs testing at a constant temperature, regardless of heat from the semiconductors radiating the heat from the semiconductors quickly and efficiently to produce more accurate test results.

Accurate testing improves productivity and saves expenses by removing faulty test results caused by identifying qualified semiconductors as defective semiconductors due to heat radiated from the semiconductor devices 70.

Although a few embodiments of the present invention have been shown and described, it would be appreciated by those skilled in the art that changes may be made in these embodiments without departing from the principles and/or spirit of the invention, the scope of which is defined in the appended claims and their equivalents.

What is claimed is:
1. An inspecting apparatus for a semiconductor device comprising:
   a match plate;
   a contact module combinable with the match plate and comprising,
      a radiator to transfer heat away from the semiconductor device, and
      a tester to contact leads of the semiconductor device;
   an insert module installed on a bottom of the contact module, wherein the insert module has a semiconductor device accommodator to accommodate the semiconductor device; and
   an auxiliary radiation member installed on a bottom of the insert module, to radiate heat from the semiconductor device to the outside,
   wherein the semiconductor device is inserted into the semiconductor device accommodator,
   wherein the insert module is partitioned into a plurality of semiconductor device accommodators by a horizontal partition wall and a vertical partition wall, and
   wherein each semiconductor device accommodator accommodates the semiconductor device within the horizontal partition wall and the vertical partition wall.

2. The inspecting apparatus according to claim 1, wherein the insert module is partitioned into 4 semiconductor device accommodators to accommodate 4 semiconductor devices.

3. The inspecting apparatus according to claim 1, wherein the horizontal partition wall and the vertical partition wall protrude inward from a bottom of an inside of the insert module.

4. An inspecting apparatus for a semiconductor device comprising:
   a match plate;
   a contact module combinable with the match plate and comprising,
      a radiator to transfer heat away from the semiconductor device, and
      a tester to contact leads of the semiconductor device;
   an insert module installed on a bottom of the contact module, having a semiconductor device accommodator to accommodate the semiconductor device; and
   an auxiliary radiation member installed on a bottom of the insert module, to radiate heat from the semiconductor device to the outside,
   wherein the insert module is partitioned into a plurality of semiconductor device accommodators by a horizontal partition wall and a vertical partition wall,
   wherein the insert module is formed with,
   an upper opening through which the semiconductor device is inserted into the semiconductor device accommodator, and
   a bottom opening corresponding to the upper opening, and
   wherein the auxiliary radiation member is disposed on the bottom of the insert module along a longitudinal direction of the insert module to contact the bottom of the semiconductor device through the bottom opening.

5. The inspecting apparatus according to claim 4, wherein each one of the plurality of semiconductor device accommodators comprises a pair of latch members to support opposite sides of the semiconductor device.

6. The inspecting apparatus according to claim 5, wherein the semiconductor device is inserted into one of the plurality of semiconductor device accommodators to be exposed through the bottom opening while contacting the auxiliary radiation member.

7. The inspecting apparatus according to claim 5, wherein the auxiliary radiation member is made of material containing aluminum.

8. The inspecting apparatus according to claim 7, wherein the match plate is selectively raised and lowered with respect to the semiconductor device.

9. The inspecting apparatus according to claim 7, wherein the match plate is formed with a plurality of holes respectively combinable with a plurality of contact modules.

10. The inspecting apparatus according to claim 1, wherein the insert module and the auxiliary radiation member are combined into one body.

11. An inspecting apparatus for a semiconductor device comprising:
   a match plate;
   a contact module combinable with the match plate and comprising,
      a radiator to transfer heat away from the semiconductor device, and
      a tester to contact leads of the semiconductor device;
   an insert module installed on a bottom of the contact module, having a semiconductor device accommodator to accommodate the semiconductor device; and
   an auxiliary radiation member installed on a bottom of the insert module, to radiate heat from the semiconductor device to the outside,
   wherein the radiator comprises:
   a heat sink;
   a contact pusher to contact the semiconductor device; and
   a heat flat pusher provided between the contact pusher and the heat sink, to transfer heat from the semiconductor device to the heat sink via the contact pusher.

12. The inspecting apparatus according to claim 11, wherein the tester comprises:
   a contact block combined with the match plate and formed with a heat sink seat, to accommodate the heat sink, and a through hole through which the heat flat pusher passes; and
   a lead pusher combined with a bottom of the contact block to contact the leads of the semiconductor device selectively according to elevation of the contact block by the match plate.

13. The inspecting apparatus according to claim 12, wherein the contact block is formed with an air inlet through which air flows into the heat sink seat and an air outlet through which the air flows out of the heat sink seat.

14. The inspecting apparatus according to claim 13, further comprising:
   a first elastic member installed on a circumferential part of the heat flat pusher to allow the contact block and the lead pusher to lift up and down elastically; and
   a second elastic member installed between the match plate and the contact block to allow the lead pusher to contact the leads of the semiconductor by elevation of the contact block by the match plate.

15. The inspecting apparatus according to claim 14, wherein the first elastic member and the second elastic member comprise springs, respectively.

16. The inspecting apparatus according to claim 11, wherein the heat sink, the contact pusher, and the heat flat pusher are made of material containing aluminum.

17. An inspecting apparatus for a semiconductor device comprising:
   a match plate;
   a contact module combinable with the match plate and comprising, a radiator to transfer heat away from the semiconductor device, and a tester to contact leads of the semiconductor device;

an insert module installed on a bottom of the contact module, having a semiconductor device accommodator to accommodate the semiconductor device; and an auxiliary radiation member installed on a bottom of the insert module, to radiate heat from the semiconductor device to the outside, wherein the radiator comprises:

a heat sink;

a contact pusher to contact the semiconductor device; and a heat flat pusher provided between the contact pusher and the heat sink to transfer heat from the semiconductor device to the heat sink via the contact pusher.

18. The inspecting apparatus according to claim 17, wherein the heat sink is formed with a plurality of groove strips on an outside surface to increase an exposed surface area.

19. The inspecting apparatus according to claim 17, wherein a first side of the contact pusher is formed with a flat face to contact the semiconductor device, and a second side of the contact pusher is combined with the heat flat pusher.

20. The inspecting apparatus according to claim 19, wherein the second side of the contact pusher is screw combined with the heat flat pusher.

21. The inspecting apparatus according to claim 17, wherein a first end of the heat flat pusher is screw combined with the heat sink, and a second end of the heat flat pusher is screw combined with the contact pusher.

22. The inspecting apparatus according to claim 17, wherein the tester comprises:

a contact block combined with the match plate formed with a heat sink seat, to accommodate the heat sink, and a through hole through which the heat flat pusher passes; and a lead pusher combined with a bottom of the contact block to contact the leads of the semiconductor device selectively according to elevation of the contact block by the match plate.

23. The inspecting apparatus according to claim 22, wherein the contact block is formed with an air inlet through which air flows into the heat sink seat and an air outlet through which the air flows out of the heat sink peat.

24. The inspecting apparatus according to claim 23, further comprising:

a first elastic member installed on a circumferential part of the heat flat pusher to allow the contact block and the lead pusher to lift up and down elastically; and a second elastic member installed between the match plate and the contact block to allow the lead pusher to contact the leads of the semiconductor device by elevation of the contact block by the match plate.

25. The inspecting apparatus according to claim 24, wherein the first elastic member and the second elastic member comprise springs, respectively.

26. The inspecting apparatus according to claim 17, wherein the heat sink, the contact pusher, and the heat flat pusher are made of material containing aluminum.

* * * * *

UNITED STATES PATENT AND TRADEMARK OFFICE
CERTIFICATE OF CORRECTION

| | |
|---|---|
| PATENT NO. | : 7,176,704 B2 |
| APPLICATION NO. | : 10/823546 |
| DATED | : February 13, 2007 |
| INVENTOR(S) | : Je-hyoung Ryu et al. |

It is certified that error appears in the above-identified patent and that said Letters Patent is hereby corrected as shown below:

Column 10, Line 13, change "peat." to --seat.--.

Signed and Sealed this

Twenty-second Day of May, 2007

JON W. DUDAS
*Director of the United States Patent and Trademark Office*